US007999719B2

(12) United States Patent
Jeon et al.

(10) Patent No.: US 7,999,719 B2
(45) Date of Patent: Aug. 16, 2011

(54) MULTI-STAGE SUCCESSIVE APPROXIMATION REGISTER ANALOG-TO-DIGITAL CONVERTER AND ANALOG-TO-DIGITAL CONVERTING METHOD USING THE SAME

(75) Inventors: Young Deuk Jeon, Daejeon (KR); Young Kyun Cho, Daejeon (KR); Jae Won Nam, Pohang-si (KR); Jong Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/433,764

(22) Filed: Apr. 30, 2009

(65) Prior Publication Data

US 2010/0066583 A1   Mar. 18, 2010

(30) Foreign Application Priority Data

Sep. 16, 2008 (KR) .................. 10-2008-0090653

(51) Int. Cl.
*H03M 1/38* (2006.01)
(52) U.S. Cl. ........ 341/161; 341/118; 341/120; 341/155; 341/162; 341/172
(58) Field of Classification Search .......... 341/118–121, 341/155, 161, 162, 172
See application file for complete search history.

(56) References Cited

U.S. PATENT DOCUMENTS

| | | | | |
|---|---|---|---|---|
| 5,006,854 A | * | 4/1991 | White et al. ............... | 341/172 |
| 6,124,818 A | * | 9/2000 | Thomas et al. ............ | 341/155 |
| 6,879,277 B1 | * | 4/2005 | Cai ........................... | 341/155 |
| 6,914,550 B2 | * | 7/2005 | Cai ........................... | 341/155 |
| 6,985,101 B2 | * | 1/2006 | Leung et al. .............. | 341/172 |
| 7,023,373 B2 | | 4/2006 | da Fonte Dias | |
| 7,397,310 B2 | * | 7/2008 | Sutardja ..................... | 330/311 |
| 7,501,965 B2 | * | 3/2009 | Janakiraman .............. | 341/118 |
| 7,515,083 B2 | * | 4/2009 | Chen et al. ................ | 341/156 |
| 7,821,441 B2 | * | 10/2010 | Westwick et al. ......... | 341/163 |
| 2004/0001018 A1 | * | 1/2004 | Hales ......................... | 341/155 |
| 2006/0158365 A1 | * | 7/2006 | Kernahan et al. ......... | 341/155 |
| 2010/0109924 A1 | * | 5/2010 | Cho et al. .................. | 341/118 |

FOREIGN PATENT DOCUMENTS

| | | |
|---|---|---|
| KR | 1020010005545 A | 1/2001 |
| KR | 1020020079862 A | 10/2002 |

OTHER PUBLICATIONS

Simon M. Louwsma et al., "A 1.35 GS/s, 10 b, 175 mW Time-Interleaved AD Converter in 0.13 µm CMOS," IEEE Journal of Solid-State Circuits, Apr. 2008, pp. 778-786, vol. 43, No. 4.

* cited by examiner

Primary Examiner — Linh V Nguyen

(57) ABSTRACT

A multi-stage Successive Approximation Register Analog-to-Digital Converter (SAR ADC) and an analog-to-digital converting method using the same are provided. The multi-stage SAR ADC connects small-size and low-power SAR ADCs in multiple stages, thereby reducing a whole chip size and power consumption. The analog-to-digital converting method simultaneously performs analog-to-digital conversions in the SAR ADCs connected in the multiple stages, thereby reducing an analog-to-digital conversion time and maintaining an operating rate of several tens of MHz to several hundreds of MHz similar to that of a pipeline ADC.

13 Claims, 3 Drawing Sheets

MULTI-STAGE SUCCESSIVE APPROXIMATION REGISTER ANALOG-TO-DIGITAL CONVERTER AND ANALOG-TO-DIGITAL CONVERTING METHOD USING THE SAME

CROSS-REFERENCE TO RELATED APPLICATION

This application claims priority to and the benefit of Korean Patent Application No. 10-2008-0090653, filed Sep. 16, 2008, the disclosure of which is incorporated herein by reference in its entirety.

BACKGROUND

1. Field of the Invention

The present invention relates to a multi-stage Successive Approximation Register Analog-to-Digital Converter (SAR ADC) and an analog-to-digital converting method using the same, and more particularly, to a multi-stage SAR ADC capable of increasing an analog-to-digital conversion rate by connecting SAR ADCs in multiple stages and an analog-to-digital converting method using the same.

2. Discussion of Related Art

In general, a SAR ADC is an ADC having a structure in which a single comparator is repeatedly used. The SAR ADC has a simple circuit without an analog circuit using an amplifier like a Sampling/Holding Amplifier (SHA), thereby minimizing an area and power consumption. The SAR ADC is easily applicable to a low-voltage circuit. However, since the SAR ADC repeatedly uses the same circuit, there is a problem in that an operating rate is limited to several tens of MHz. Accordingly, a conventional high-speed and high-resolution ADC is usually implemented using a pipeline ADC.

FIG. 1 schematically shows a structure of a conventional pipeline ADC.

Referring to FIG. 1, the conventional pipeline ADC includes a SHA 110 for sampling and holding a first analog input voltage $V_{in}$, a plurality of sub-ranging ADCs 120a and 120b, a flash ADC 130, and a digital compensation circuit 140.

In the conventional pipeline ADC, the sub-ranging ADCs 120a and 120b sequentially perform digital conversion of the analog input voltage $V_{in}$ and the flash ADC 130 performs digital conversion for a Least Significant Bit (LSB). Accordingly, target digital conversion resolution of the analog input voltage $V_{in}$ is a sum of digital conversion resolutions of the sub-ranging ADCs 120a and 120b and the flash ADC 130.

Here, a detailed structure of each of the sub-ranging ADCs 120a and 120b includes a flash ADC 129 and a Multiplying Digital-to-Analog Converter (MDAC) configured with a SHA 121, an adder 123, an amplifier 125, and a DAC 127.

Operation of the sub-ranging ADCs 120a and 120b will be described. When an analog signal is input from a front stage, the flash ADC 129 digitally converts a partial signal and the DAC 127 converts the digitally converted partial signal into an analog signal. Then, the adder 123 adds a sampled analog signal from the SHA 121 to the analog signal from the DAC 127. The amplifier 125 amplifies and outputs a signal from the adder 123 to the next stage.

As described above, the pipeline ADC is configured with the sub-ranging ADCs 120a and 120b for digitally converting a portion of an input signal. Accordingly, the ADC may perform relatively high-speed and high-resolution analog-to-digital conversion.

However, the SHA 121 included in each of the sub-ranging ADCs 120a and 120b is configured with one amplifier and multiple capacitors. As the operating rate and resolution of the ADC increase, an amount of current to be consumed increases due to a Direct Current (DC) gain limit and bandwidth of the amplifier. Since the SHA 121 is placed in an input stage, noise and non-linear characteristics of the capacitor and amplifier affect the entire ADC, resulting in degradation of performance. In addition, since the number of comparators to be used in the flash ADC 129 increases to a power of 2 according to required resolution, a chip size significantly increases when an at least 4-bit flash ADC is used.

SUMMARY OF THE INVENTION

The present invention provides a multi-stage SAR ADC that can reduce a chip size and power consumption while maintaining an operating rate of several tens of MHz to several hundreds of MHz similar to that of a pipeline ADC.

The present invention also provides an analog-to-digital converting method that can reduce an analog-to-digital conversion time.

According to an exemplary embodiment of the present invention, there is provided a multi-stage SAR ADC including: a first SAR ADC that digitally converts a first analog input voltage into n bits, where n is an integer equal to or greater than 1; and a second SAR ADC that digitally converts a remaining voltage after digital conversion by the first SAR ADC into m bits, where m is an integer equal to or greater than 1, wherein the first SAR ADC digitally converts a second analog input voltage while the second SAR ADC digitally converts the remaining voltage.

The multi-stage SAR ADC may further include a remaining voltage amplifier that amplifies the remaining voltage.

The first SAR ADC may include: a first capacitor array that generates n-bit level voltages; a first comparator that compares the first analog input voltage with the n-bit level voltages; and a first SAR logic circuit that digitally converts the first analog input voltage into the n bits using the comparison result from the first comparator. The second SAR ADC may include: a second capacitor array that generates m-bit level voltages; a second comparator that compares the remaining voltage with the m-bit level voltages; and a second SAR logic circuit that digitally converts the remaining voltage into the m bits using the comparison result from the second comparator.

According to another embodiment of the present invention, there is provided an analog-to-digital converting method using a multi-stage SAR ADC, including: inputting a first analog input voltage to a first SAR ADC; digitally converting the first analog input voltage into an n-bit digital signal by comparing the first analog input voltage with predetermined n-bit level voltages, where n is an integer equal to or greater than 1; inputting a remaining voltage after digital conversion by the first SAR ADC to a second SAR ADC; and digitally converting the remaining voltage into an m-bit digital signal by comparing the remaining voltage with predetermined m-bit level voltages, where m is an integer equal to or greater than 1.

The analog-to-digital converting method may further include: amplifying, by a remaining voltage amplifier, the remaining voltage. The analog-to-digital converting method may further include: digitally converting, by at least one SAR ADC, a remaining voltage after digital conversion by the second SAR ADC.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

A multi-stage SAR ADC and an analog-to-digital converting method using the same according to exemplary embodiments of the present invention will be described in detail herein below with reference to the accompanying drawings.

Figure 1:
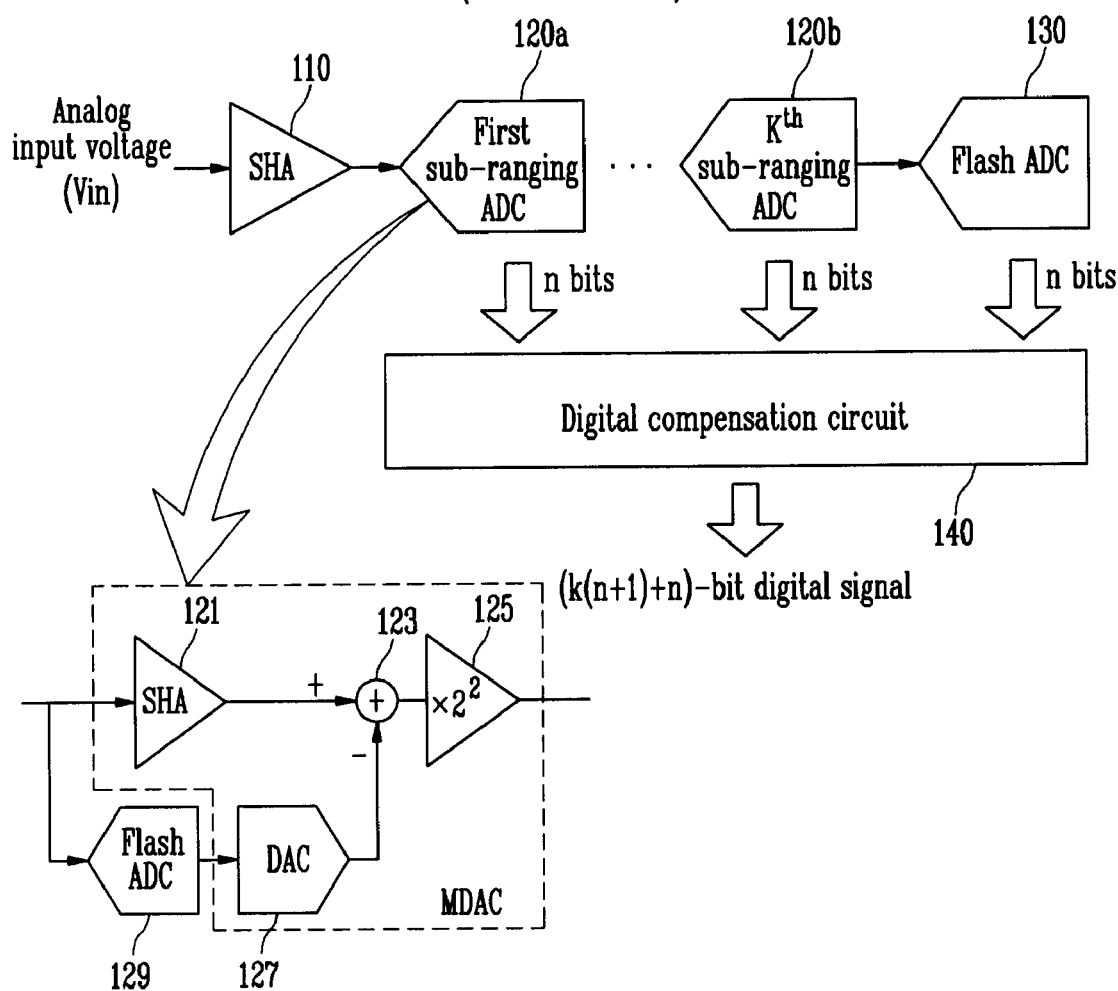
FIG. 1 schematically shows a structure of a conventional pipeline ADC.
Figure 2:
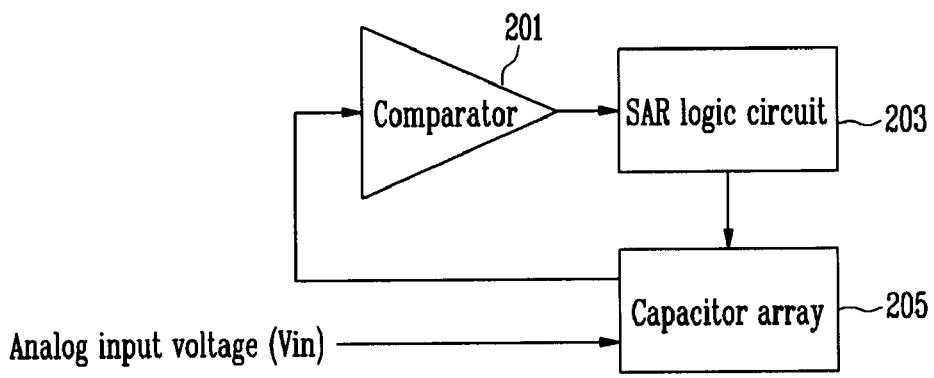
FIG. 2 shows a structure of a SAR ADC applied to the present invention.

FIG. 2 shows a structure of a SAR ADC applied to the present invention.

Referring to FIG. 2, the SAR ADC applied to the present invention includes a comparator 201, a SAR logic circuit 203, and a capacitor array 205.

The comparator 201 generates a high- or low-level signal by comparing a level voltage generated by the capacitor array 205 with an analog input voltage $V_{in}$. The SAR logic circuit 203 converts the analog input voltage $V_{in}$ into a digital signal using the signal generated by the comparator 201.

The capacitor array 205 includes a plurality of switched capacitors (not shown). Each of the switched capacitors is responsible for generating a level voltage. The level voltage is compared with the analog input voltage $V_{in}$ by properly dividing a reference voltage $V_{ref}$ according to digital resolution of the ADC.

For example, in the SAR ADC with 4-bit resolution, the switched capacitors included in the capacitor array 205 generate resolution-based level voltages such as $V_{ref}/2$, $V_{ref}/4$, $3V_{ref}/4$, $V_{ref}/8$, $3V_{ref}/8$, $5V_{ref}/8$, $7V_{ref}/8$, $V_{ref}/16$, $3V_{ref}/16$, $5V_{ref}/16$, $7V_{ref}/16$, $9V_{ref}/16$, $11V_{ref}/16$, $13V_{ref}/16$, and $15V_{ref}/16$.

To generate an n-bit digital signal in the SAR ADC, the same comparison operation should be repeated n times. For example, when a reference voltage is denoted by $V_{ref}$ in the SAR ADC with 4-bit digital resolution and a first comparison with an input voltage is made, a high- or low-level signal is determined by first comparing the input voltage with $V_{ref}/2$. According to the comparison result, the input voltage is compared with $V_{ref}/4$ or $3V_{ref}/4$. According to the comparison result, the input voltage is further compared with one of $V_{ref}/8$, $3V_{ref}/8$, $5V_{ref}/8$, and $7V_{ref}/8$. Then, the input voltage is further compared with one of $V_{ref}/16$, $3V_{ref}/16$, $5V_{ref}/16$, $7V_{ref}/16$, $9V_{ref}/16$, $11V_{ref}/16$, $13V_{ref}/16$, and $15V_{ref}/16$. That is, there is a disadvantage in that an operating rate is low since the same comparator operates every comparison time.

Figure 3:
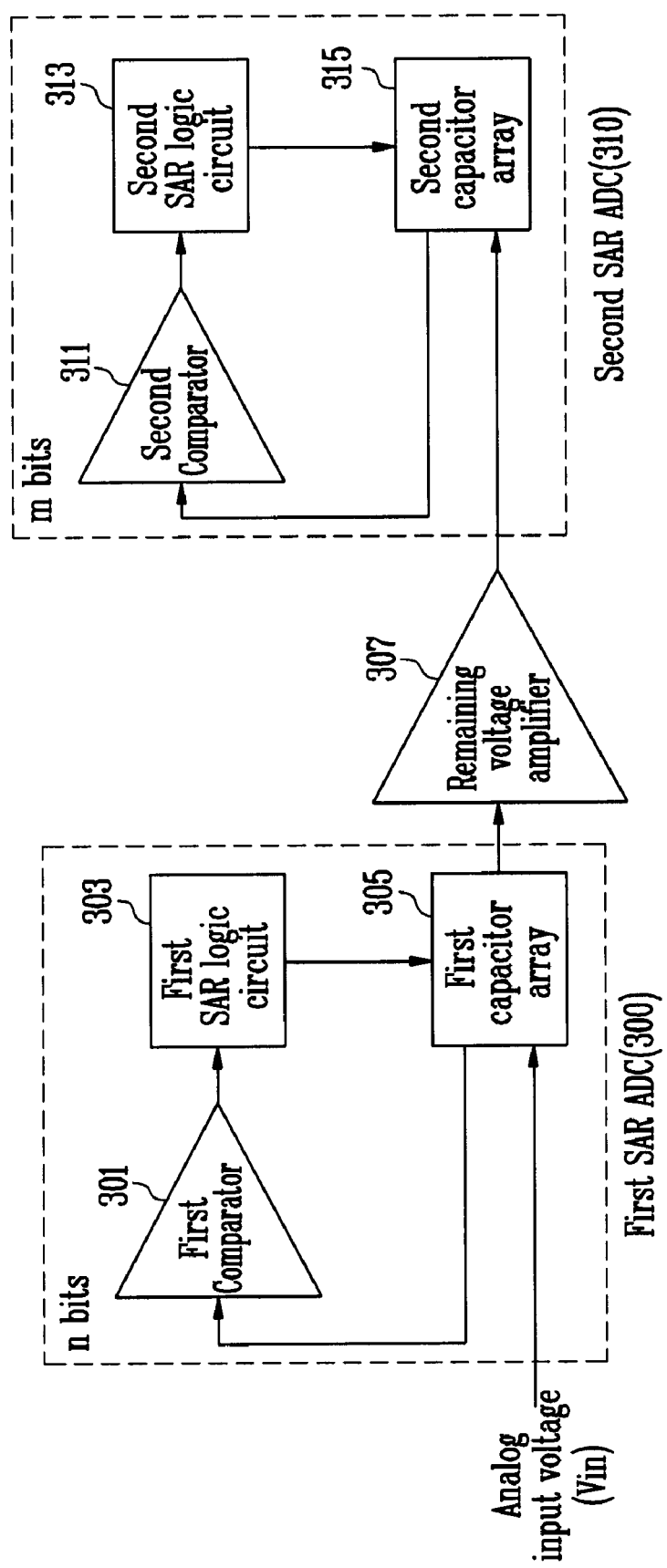
FIG. 3 shows a structure of a multi-stage SAR ADC according to an exemplary embodiment of the present invention.

FIG. 3 shows a structure of a multi-stage SAR ADC according to an exemplary embodiment of the present invention.

The multi-stage SAR ADC has a structure in which multiple SAR ADCs corresponding to the SAR ADC of FIG. 2 are connected. That is, a rear stage of a first SAR ADC 300 is connected to a second SAR ADC 310, thereby increasing an analog-to-digital conversion rate.

The first SAR ADC 300 includes a first comparator 301, a first SAR logic circuit 303, and a first capacitor array 305. The second SAR ADC 310 includes a second comparator 311, a second SAR logic circuit 313, and a second capacitor array 315.

A remaining voltage amplifier 307 is connected between the first SAR ADC 300 and the second SAR ADC 310. The remaining voltage amplifier 307 amplifies a remaining voltage output from the first SAR ADC 300.

When the multi-stage SAR ADC receives an analog input voltage $V_{in}$, the first SAR ADC 300 performs n-bit digital conversion. Then, the remaining voltage amplifier 307 amplifies the remaining voltage after the n-bit digital conversion. Then, the second SAR ADC 310 digitally converts the amplified remaining voltage into m bits.

Consequently, the analog input voltage $V_{in}$ passes through both the first SAR ADC 300 and the second SAR ADC 310 and is digitally converted into (n+m) bits.

In this case, a time of digitally converting one analog input voltage $V_{in}$ into the (n+m) bits may be similar to that of a conventional SAR ADC with (n+m)-bit resolution. However, when multiple analog input voltages are successively input in sequence, the entire analog-to-digital conversion time is remarkably reduced since the first SAR ADC 300 digitally converts a second analog input voltage into n bits while the second SAR ADC 310 digitally converts a first analog input voltage into m bits.

An example of simply connecting two SAR ADCs has been described, but an extension may be made to connect at least three SAR ADCs as in a pipeline ADC.

Figure 4:
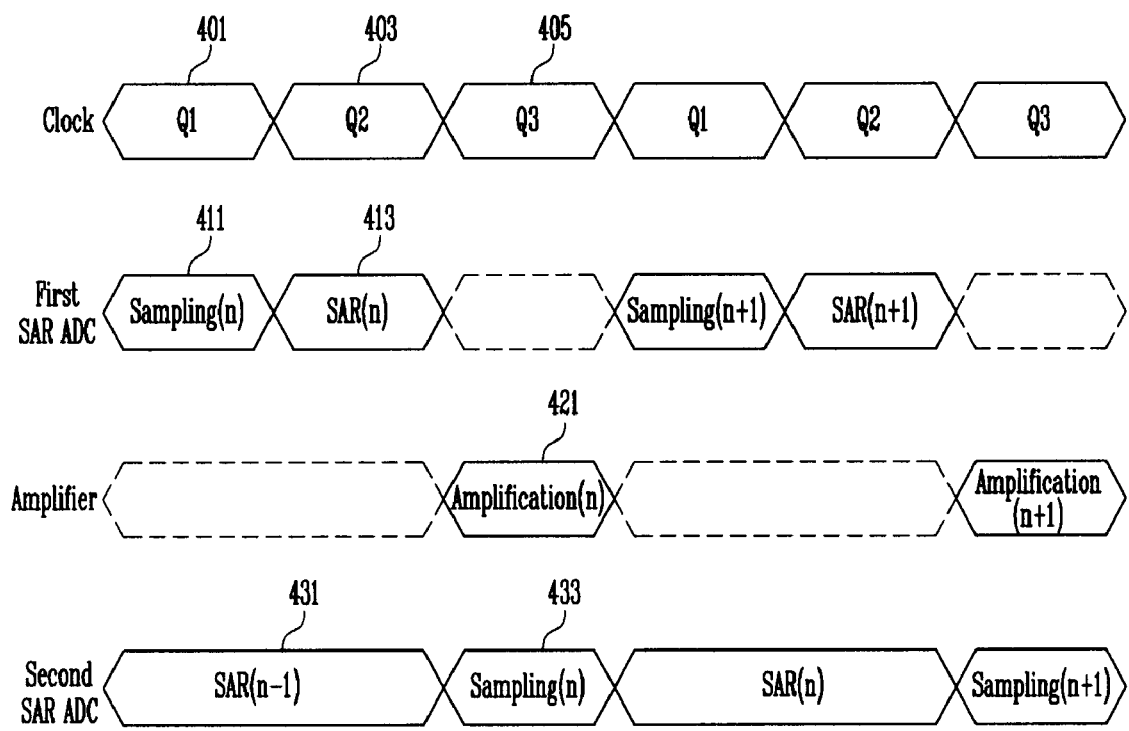
FIG. 4 shows a timing diagram of the multi-stage SAR ADC according to an exemplary embodiment of the present invention.

FIG. 4 shows a timing diagram of the multi-stage SAR ADC according to an exemplary embodiment of the present invention.

Referring to FIG. 4, an operation of the SAR ADC according to an exemplary embodiment of the present invention is controlled in response to a clock signal. In the exemplary embodiment, different length clocks of a Q1 clock 401, a Q2 clock 403, and a Q3 clock 405 are needed.

The first SAR ADC samples an $n^{th}$ analog signal in response to the Q1 clock 401 (as indicated by reference numeral 411) and performs analog-to-digital conversion in response to the Q2 clock 403 (as indicated by reference numeral 413). In the Q3 clock 405, no special operation is performed.

The remaining voltage amplifier does not operate in the Q1 clock 401 and the Q2 clock 403, but amplifies a remaining voltage output from the first SAR ADC in the Q3 clock 405 (as indicated by reference numeral 421).

The second SAR ADC digitally converts an $(n-1)^{th}$ analog signal in the Q1 clock 401 and the Q2 clock 403 (as indicated by reference numeral 431) and samples the amplified remaining voltage of the $n^{th}$ analog signal output from the remaining voltage amplifier (as indicated by reference numeral 433).

The above-described operations are repeatedly performed in response to the Q1 clock 401, the Q2 clock 403, and the Q3 clock 405. When analog input voltages are input successively (n−1, n, n+1, etc.), the first SAR ADC digitally converts an $n^{th}$ analog input voltage while the second SAR ADC digitally converts an $(n-1)^{th}$ analog input voltage. Therefore, the entire analog-to-digital conversion time can be reduced. This is more effective in the case of at least two SAR ADCs.

According to the present invention, a multi-stage SAR ADC connects small-area and low-power SAR ADCs in multiple stages, thereby reducing a chip size and power consumption. An analog-to-digital converting method simultaneously performs analog-to-digital conversions in the SAR ADCs connected in the multiple stages, thereby reducing an analogto-digital conversion time and maintaining an operating rate of several tens of MHz to several hundreds of MHz similar to that of a pipeline ADC.

According to the present invention, a multi-stage SAR ADC can reduce a chip size and power consumption while maintaining an operating rate of several tens of MHz to several hundreds of MHz similar to that of a pipeline ADC. An analog-to-digital converting method can reduce an analog-to-digital conversion time.

While the present invention has been shown and described in connection with exemplary embodiments thereof, it will be apparent to those skilled in the art that various modifications can be made without departing from the spirit and scope of the invention as defined by the appended claims.

What is claimed is:

1. A multi-stage Successive Approximation Register Analog-to-Digital Converter (SAR ADC) comprising:
   a first SAR ADC comprising:
      a first capacitor array configured to generate n-bit level voltages,
      a first comparator configured to compare a first analog input voltage with the n-bit level voltages, and
      a first SAR logic circuit configured to digitally convert the first analog input voltage into n bits using the comparison result from the first comparator where n is an integer equal to or greater than 1;
   a remaining voltage amplifier configured to amplify a remaining voltage output from the first SAR ADC and to output an amplified remaining voltage; and
   a second SAR ADC configured to digitally convert the amplified remaining voltage into m bits, where m is an integer equal to or greater than 1,
   wherein the first SAR ADC digitally converts a second analog input voltage while the second SAR ADC digitally converts the amplified remaining voltage,
   wherein the first SAR ADC and the remaining voltage amplifier operate during different periods of time,
   wherein the first SAR ADC, the remaining voltage amplifier, and the second SAR ADC are separated with each other.

2. The multi-stage SAR ADC of claim 1, wherein the second SAR ADC comprises:
   a second capacitor array configured to generate m-bit level voltages;
   a second comparator configured to compare the remaining voltage with the m-bit level voltages; and
   a second SAR logic circuit configured to digitally convert the remaining voltage into the m bits using the comparison result from the second comparator.

3. The multi-stage SAR ADC of claim 1, wherein the first capacitor array comprises ($2^n-1$) capacitors.

4. The multi-stage SAR ADC of claim 1, wherein the first comparator outputs a high- or low-level signal based on a difference between the n-bit level voltages and the first analog input voltage.

5. The multi-stage SAR ADC of claim 2, wherein the second capacitor array comprises ($2^m-1$) capacitors.

6. The multi-stage SAR ADC of claim 2, wherein the second comparator outputs a high- or low-level signal based on a difference between the m-bit level voltages and the remaining voltage.

7. The multi-stage SAR ADC of claim 1, further comprising:
   a plurality of SAR ADCs connected in series and configured to digitally convert a remaining voltage after digital conversion by the second SAR ADC; and
   a remaining voltage amplifier positioned between two neighboring SAR ADCs.

8. The multi-stage SAR ADC of claim 1, wherein digital conversion resolution of the first analog input voltage is a sum of digital conversion resolution of the first SAR ADC and digital conversion resolution of the second SAR ADC.

9. The multi-stage SAR ADC of claim 1, wherein the first comparator operates only when the first SAR ADC converts the first analog input voltage, and the remaining voltage amplifier operates only when the second SAR ADC converts the amplified remaining voltage.

10. An analog-to-digital converting method using a multi-stage SAR ADC, comprising:
    inputting a first analog input voltage to a first SAR ADC;
    comparing the first analog input voltage with predetermined n-bit level voltages using a first comparator included in the first SAR ADC, where n is an integer equal to or greater than 1;
    digitally converting the first analogy input voltage into an n-bit digital signal using a first SAR logic circuit included in the first SAR ADC;
    amplifying a remaining voltage output from the first SAR ADC using a remaining voltage amplifier to output an amplified remaining voltage;
    inputting the amplified remaining voltage to a second SAR ADC; and
    digitally converting the amplified remaining voltage into an m-bit digital signal by comparing the amplified remaining voltage with predetermined m-bit level voltages using a second SAR ADC, where m is an integer equal to or greater than 1,
    wherein the first SAR ADC and the remaining voltage amplifier operate during different periods of time, and
    wherein the first SAR ADC, the remaining voltage amplifier and the second SAR ADC are separated from each other.

11. The analog-to-digital converting method of claim 10, further comprising:
    digitally converting a remaining voltage after digital conversion by the second SAR ADC using at least one SAR ADC.

12. The analog-to-digital converting method of claim 10, wherein digital conversion resolution of the first analog input voltage is a sum of digital conversion resolution of the first SAR ADC and digital conversion resolution of the second SAR ADC.

13. The analog-to-digital converting method of claim 10, wherein the first comparator operates only when the first SAR ADC converts the first analog input voltage, and the remaining voltage amplifier operates only when the second SAR ADC converts the amplified remaining voltage.

* * * * *